(12) United States Patent
Hager et al.

(10) Patent No.: US 9,169,677 B2
(45) Date of Patent: Oct. 27, 2015

(54) LOCKING DEVICE WITH DOOR INTERROGATOR

(71) Applicants: Alexander Hager, Erlangen (DE); Jürgen Kummer, Amberg (DE)

(72) Inventors: Alexander Hager, Erlangen (DE); Jürgen Kummer, Amberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 178 days.

(21) Appl. No.: 13/765,801

(22) Filed: Feb. 13, 2013

(65) Prior Publication Data
US 2013/0256102 A1  Oct. 3, 2013

(30) Foreign Application Priority Data

Mar. 30, 2012 (DE) .......................... 10 2012 205 234

(51) Int. Cl.
| | |
|---|---|
| *E05C 19/00* | (2006.01) |
| *E05C 1/08* | (2006.01) |
| *H05K 5/02* | (2006.01) |
| *H01H 9/22* | (2006.01) |
| *E05C 1/02* | (2006.01) |
| *H02B 1/38* | (2006.01) |

(52) U.S. Cl.
CPC .. *E05C 1/08* (2013.01); *H01H 9/22* (2013.01); *H05K 5/0208* (2013.01); *H05K 5/0221* (2013.01); *H02B 1/38* (2013.01); *Y10T 292/1014* (2015.04)

(58) Field of Classification Search
USPC ......... 292/137, 144, 138, 139, 143, 145, 146, 292/150, 302, 153
See application file for complete search history.

(56) References Cited

U.S. PATENT DOCUMENTS 5,125,695 A * 6/1992 Hartwell .......................... 292/62

FOREIGN PATENT DOCUMENTS

EP          2278102 A1     1/2011

* cited by examiner

*Primary Examiner* — Mark Williams
(74) *Attorney, Agent, or Firm* — Harness, Dickey & Pierce, P.L.C.

(57) ABSTRACT

A locking device is disclosed for a door. In an embodiment, the locking device includes a locking slider which is slidable into at least two positions, wherein in the first position the door is locked and in the second position the door is released for opening; and includes a guide within which the locking slider is slidably arranged. The locking slider includes a door interrogator, wherein the door interrogator can be displaced by the door into at least two door interrogator positions, wherein in the first door interrogator position with the door closed the locking slider can be shifted into one of its at least two positions, and wherein in the second door interrogator position with the door open the locking slider cannot be shifted into the first position for locking the door.

15 Claims, 6 Drawing Sheets

FIG 1

LOCKING DEVICE WITH DOOR INTERROGATOR

PRIORITY STATEMENT

The present application hereby claims priority under 35 U.S.C. §119 to German patent application number DE 10 2012 205 234.8 filed Mar. 30, 2012, the entire contents of which are hereby incorporated herein by reference.

FIELD

At least one embodiment of the invention generally relates to electrical switchgear, in particular to circuit breakers in the low-voltage range. Low voltage is typically taken to mean voltages of up to approx. 1000 volts. Given appropriate constructional dimensioning of the breaking distances, switchgear of this type can also be designed for switching voltages in excess of 1000 volts, such as e.g. up to 6.3 kV. Electrical switchgears of said type, such as low-voltage circuit breakers, are embodied in particular for interrupting current paths in an overcurrent situation and/or in the event of a short circuit. They can be implemented as single-pole or multi-pole, in particular three-pole, devices.

BACKGROUND

The function of electrical switchgear such as circuit breakers is to decouple a number of power-consuming loads from a voltage supply network if a specific malfunction occurs. The classic malfunction is the occurrence of a short-circuit current, and traditionally the circuit breakers are designed to move a switching element in the event of such a short-circuit current and thereby decouple the connection between loads and network.

Electrical switchgear is usually installed in switchgear cabinets in order to provide protection therefor. Typically such a switchgear cabinet is arranged in the vicinity of a machine which is controlled by the electronic equipment housed inside the switchgear cabinet. In order to prevent unauthorized third parties from gaining access the electrical switchgear it is known to embody the switchgear cabinet doors as lockable. For activation and deactivation purposes the electrical switchgears are equipped with drives. In other words, the drives are arranged on the electrical switchgears and enable the electrical switchgears to be switched on and off. In this case use is made in particular of drives which are movable between a switch-on position and a switch-off position in order to activate or deactivate an electrical switchgear.

Examples of known drives include direct drives, door coupling rotary drives, sidewall rotary drives and motor drives. Mechanical door locking devices for rotary drives for electrical switchgear, such as low-voltage switchgear, are known for the purpose of protecting people. In this case the mechanical door locking device in direct drives, as an integral part of the direct drive, is released as part of the electrical switchgear. In door coupling rotary drives the mechanical door locking device is released as an integral part of the coupling element between shaft and operating handle. No mechanical door locking device is known in the case of sidewall rotary drives.

When electrical switchgears are in an energized state the switchgear cabinet door should be locked for safety reasons so that an operator cannot come into contact with live parts. Furthermore, the lock should ensure that the electrical switchgear can only be activated when the switchgear cabinet door is closed.

In prior art solutions switchgear cabinet doors are locked by way of door coupling rotary drives, expanded direct drives or direct drives. In order for said drives to be able to lock the switchgear cabinet door they must be mounted directly on or behind the switchgear cabinet door. So-called remote door locking devices can be used in the case of a remote arrangement of electrical switchgear and/or drive of the electrical switchgear and switchgear cabinet door. A problem in this situation is that prior art remote door locking devices cannot detect whether the switchgear cabinet door is open or closed.

SUMMARY

At least one embodiment of the present invention is direct to remedying or at least improving upon at least one of the above-described disadvantages of known mechanical door locking devices for drives of electrical switchgear at least to some degree. In particular, a flexible mechanical door locking device is disclosed that is independent of an electrical switchgear.

A locking device for a door is disclosed. In at least one embodiment, the locking device includes a locking slider which is slidable into at least two positions, wherein in the first position the door is locked and in the second position the door is released for opening, and a guide within which the locking slider is slidably arranged, wherein the locking slider comprises a door interrogator, wherein the door interrogator can be displaced by the door into at least two door interrogator positions, wherein in the first door interrogator position with the door closed the locking slider can be shifted into one of its at least two positions, and wherein in the second door interrogator position with the door open the locking slider cannot be shifted into the first position for locking the door.

BRIEF DESCRIPTION OF THE DRAWINGS

The invention is described hereinbelow with reference to the following figures, in which.

DETAILED DESCRIPTION OF THE EXAMPLE EMBODIMENTS

The present invention will be further described in detail in conjunction with the accompanying drawings and embodiments. It should be understood that the particular embodiments described herein are only used to illustrate the present invention but not to limit the present invention.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

A locking device for a door is disclosed. In at least one embodiment, the locking device includes a locking slider which is slidable into at least two positions, wherein in the first position the door is locked and in the second position the door is released for opening, and a guide within which the locking slider is slidably arranged, wherein the locking slider comprises a door interrogator, wherein the door interrogator can be displaced by the door into at least two door interrogator positions, wherein in the first door interrogator position with the door closed the locking slider can be shifted into one of its at least two positions, and wherein in the second door interrogator position with the door open the locking slider cannot be shifted into the first position for locking the door.

A thus embodied locking device for a door is very versatile in terms of its applicability and in particular is independent of the position of the electrical switchgear, such as a low-voltage switchgear or a molded case circuit breaker for example, in a switchgear cabinet. The locking device ensures that it can only be actuated with the door closed and locks the door.

In an embodiment of the locking device the door interrogator can be moved between the at least two door interrogator positions of the locking slider only in the second position thereof.

In a further embodiment of the locking device the door interrogator comprises a first section and a second section, wherein the sections have different diameters and are assigned to both of the at least two door interrogator positions, and wherein the guide comprises a retainer for the locking slider which has a slot with a slot opening, wherein in the second door interrogator position the retainer prevents the locking slider from being moved in that the first section of the door interrogator cannot be guided through the slot because the diameter of the first section is greater than the slot diameter, and wherein in the first door interrogator position the retainer allows the locking slider to be moved in that the second section of the door interrogator can be guided through the slot because the diameter of the second section is less than the slot diameter.

In a further embodiment of the locking device, the door interrogator additionally comprises a spring which holds the door interrogator in the second door interrogator position in which the locking slider cannot be moved into the first position in order to lock the door. By this, it is ensured that the locking device cannot be actuated when the door is open.

In a further embodiment of the locking device, the second section of the door interrogator runs through the locking slider and the first section of the door interrogator is located at the end of the second section pointing away from the door.

In a further embodiment of the locking device the locking device additionally comprises a door element which is mounted on the door, wherein in the first position of the locking slider the door is locked in that the locking slider engages the door element from behind, and which in the second position of the locking slider releases the door for opening.

At least one embodiment of the invention is also directed to a switchgear cabinet. The switchgear cabinet comprises a switchgear cabinet door and a locking device according to at least one embodiment of the invention, wherein the door of the locking device is formed by the switchgear cabinet door.

In a further embodiment, the switchgear cabinet comprises an electrical switch having a drive, wherein the electrical switch is operatively connected to the locking device such that the electrical switch can only be operated if the switchgear cabinet door is closed.

In an embodiment of the switchgear cabinet, the electrical switch having the drive and the locking device are operatively connected by way of a Bowden cable.

In a further embodiment of the switchgear cabinet, the first end of the Bowden cable cooperatively interacts with the switching mechanism of the drive and the second end of the Bowden cable is connected to the locking slider, such that when the switchgear cabinet door is open the electrical switch cannot be operated, and when the switchgear cabinet door is closed the electrical switch can be operated.

Figure 1:
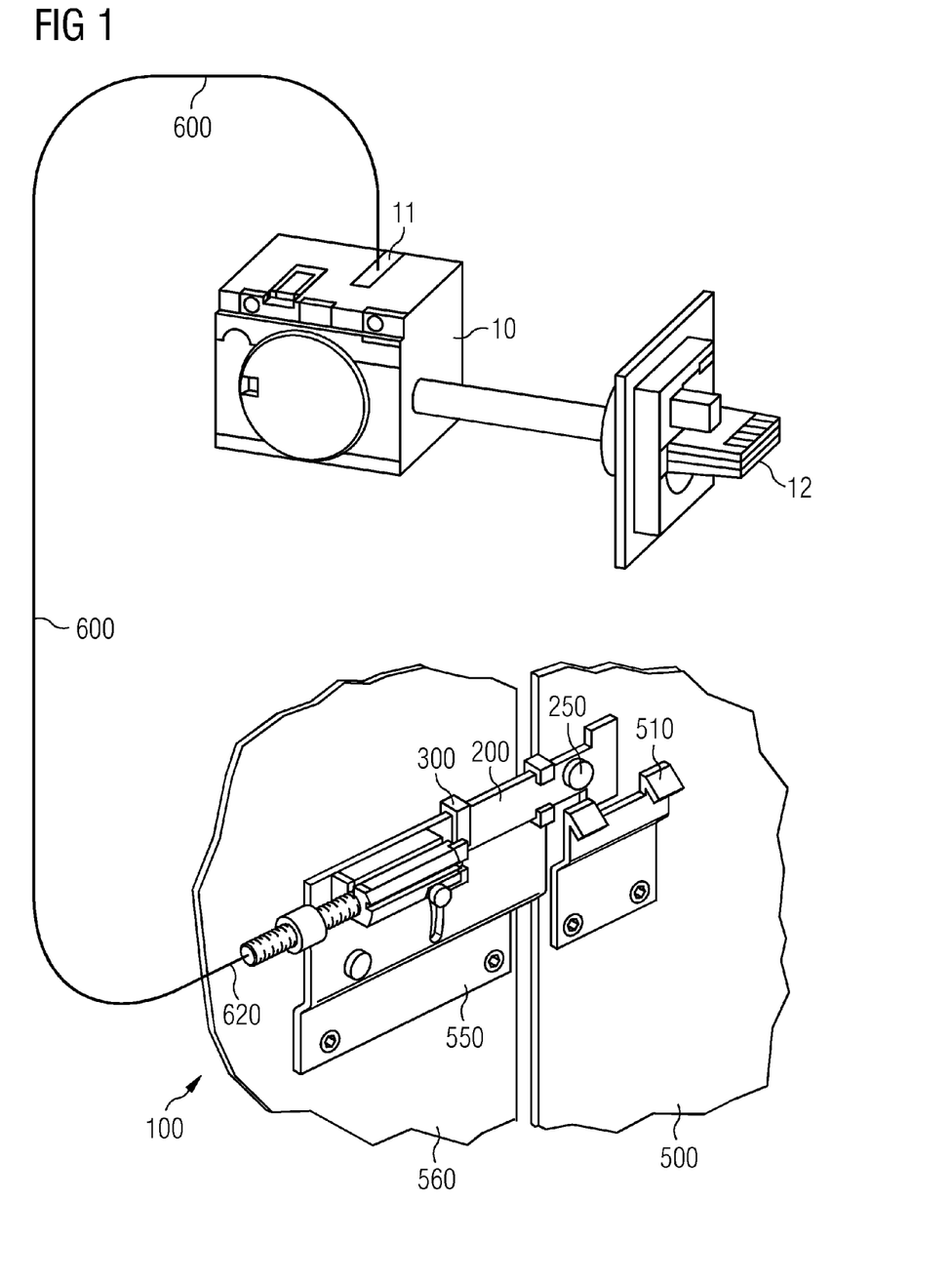
FIG. 1 shows a locking device in operative connection with an electrical switch.

FIG. 1 shows a locking device 100 for a door 500. The locking device 100 comprises a locking slider 200 which is slidable into at least two positions, wherein in the first position the door 500 is locked and in the second position the door 500 is released for opening. In FIG. 1 the locking slider 200 is in the second position for releasing the door 500. The locking device 100 further comprises a guide 300 within which the locking slider 200 is slidably arranged.

According to an embodiment of the invention the locking slider 200 comprises a door interrogator 250, wherein the door interrogator 250 can be displaced by the door 500 into at least two door interrogator positions. In the first door interrogator position with the door 500 closed, the locking slider 200 can be moved into one of its at least two positions. In the second door interrogator position with the door 500 open, the locking slider 200 cannot be moved into the first position in order to lock the door 500.

The locking device 100 according to an embodiment of the invention can be part of a switchgear cabinet, wherein the door 500 of the locking device 100 is formed by the switchgear cabinet door. The switchgear cabinet can comprise an electrical switch having a manual drive 10, wherein the drive 10 is operatively connected to a locking device 100 such that the electrical switch can only be operated if the switchgear cabinet door is closed. Toward that end the electrical switch and the locking device 100 are operatively connected by way of a Bowden cable 600. The first end of the Bowden cable 600 cooperatively interacts with the manual drive 10 of the electrical switch. The second end of the Bowden cable 600 is connected to the locking slider 200 such that when the switchgear cabinet door is open the electrical switch cannot be operated and when the switchgear cabinet door is closed the electrical switch can be operated.

The electrical switch can be actuated on the one hand by way of a rotary drive 10 with operating handle 12. On the other hand it is equally conceivable for the operating handle 12 to be mounted directly on the electrical switch. The electrical switch can be accommodated on the frame of the housing of the switchgear cabinet so that the operating handle can be actuated by the user. Equally, the electrical switch can be operated automatically by way of a motor.

The Bowden cable 600 cooperatively interacts directly with the manual drive 10 of the electrical switch. This means that the Bowden cable is actuated when the switching mechanism is actuated. The Bowden cable can for example be shortened by the switching mechanism of the electrical switch being transferred from the "OFF" position into the "ON" position.

The second end of the Bowden cable 600 is connected to the locking slider 200. Owing to the Bowden cable 600 being shortened for example as a result of the actuation of the switching mechanism of the manual electric drive 10, the locking slider 200 is pulled to the left according to the illustration in FIG. 1.

Figure 2:
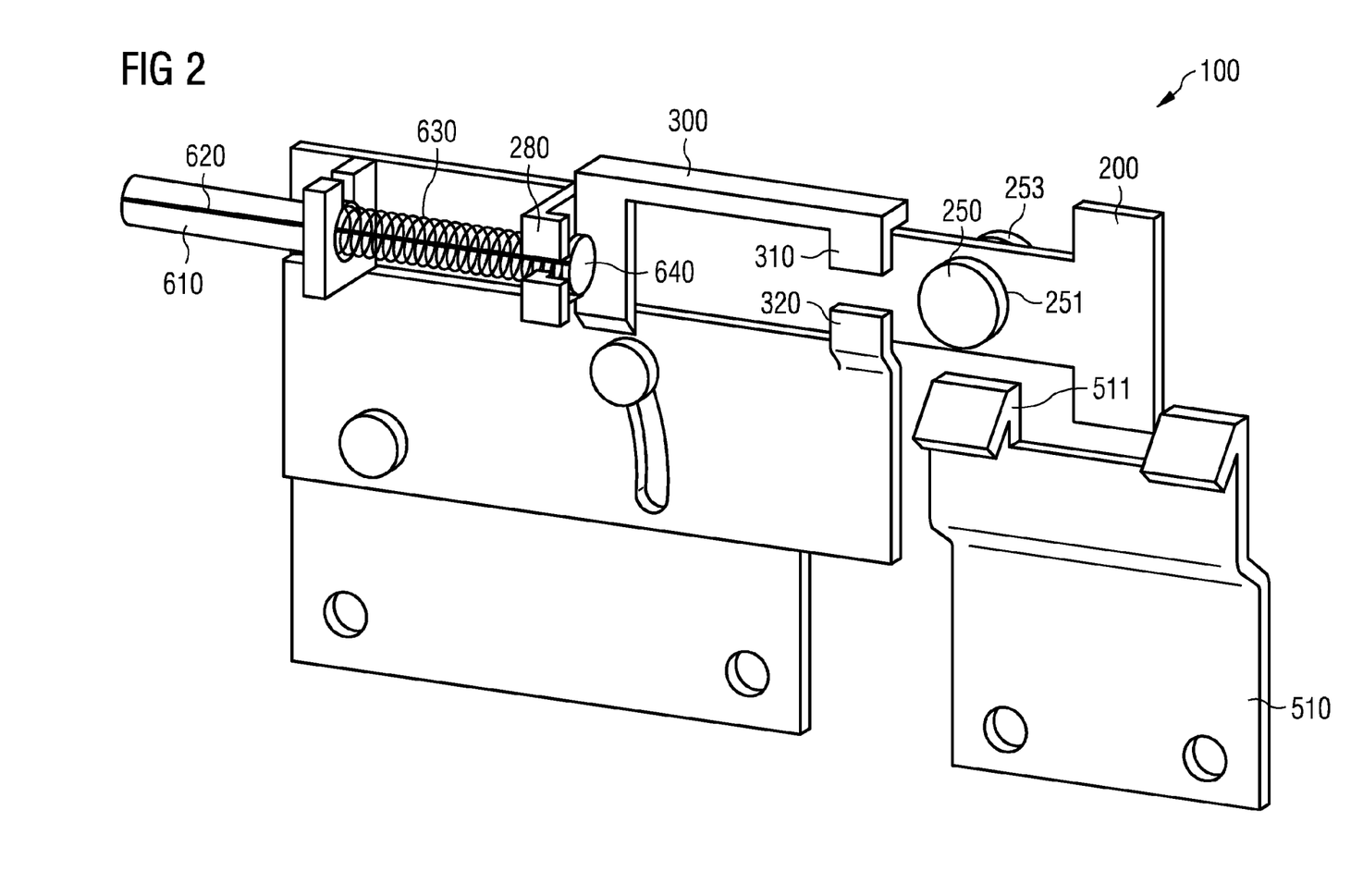
FIG. 2 shows the locking device with locking slider in the second position for releasing the door.

FIG. 2 shows the locking device 100 with the locking slider 200 in the second position, in which the door 500 is released for opening. The second end of the Bowden cable 600 is connected to the locking slider 200. The Bowden cable 600 comprises an inner core 620 which can be made of steel, for example. At the end of the steel core 620 is a nipple 640 which is hooked into the eye 280 of the locking slider 200. The Bowden cable also comprises an outer sheath 610 for mechanically guiding the Bowden cable core 620. A spring 630 can be provided which holds the locking slider 200 in the second position in which the door 500 is released for opening. Spring 630 is for example a compression spring.

The locking slider 200 is retained by a guide 300 within which the locking slider 200 is slidably arranged. The guide 300 has a slot with a slot opening, the slot being formed by the elements 310, 320. The slot with its slot opening cooperatively interacts with the door interrogator 250.

The door interrogator 250 comprises a first section 251 and a second section 252 (not shown in FIG. 2). In the second door interrogator position shown in FIG. 2 with the door 500 open, the first section 251 bears on the locking slider 200. When the Bowden cable is actuated, the locking slider 200 is moved to the left. However, this is possible only insofar as the retainer 300 with the slot formed by the elements 310, 320 prevents or blocks the displacement of the locking slider 200 because the first section 251 of the door interrogator 250 cannot be guided through the slot since the diameter of the first section 251 is greater than the slot diameter. The movement of the locking slider 200 is mechanically prevented by way of the door interrogator 250.

Figure 3:
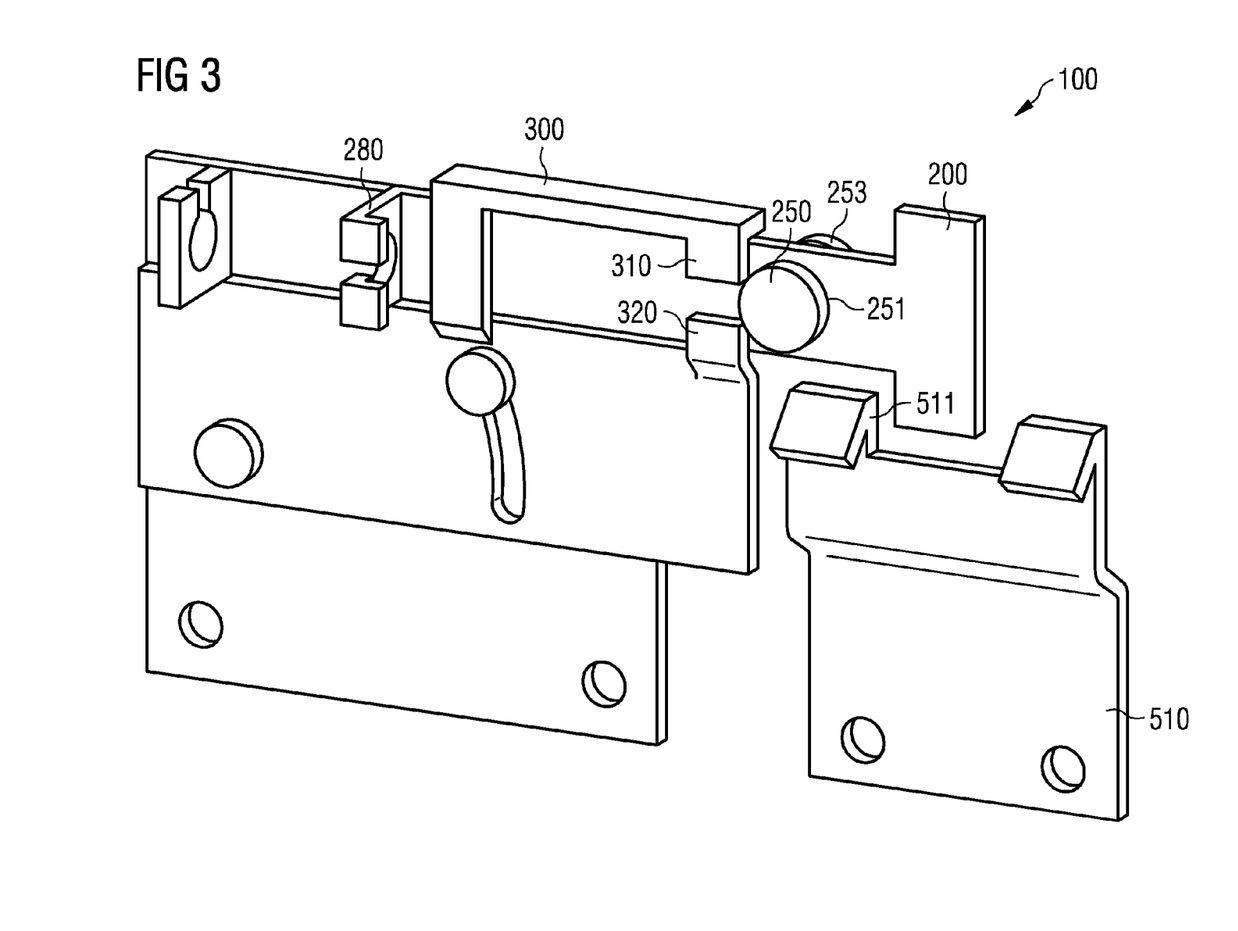
FIG. 3 shows the locking device according to FIG. 2 with door interrogator in the second door interrogator position in which the first section of the door interrogator cannot be guided through the slot.

In FIG. 3 it is shown how the locking slider 200 has been moved to the left by way of the Bowden cable up to the point at which the first section 251 touches the slot formed by the elements 310, 320 and cannot be guided through the slot because the diameter of the first section 251 is greater than the slot diameter.

Figure 4:
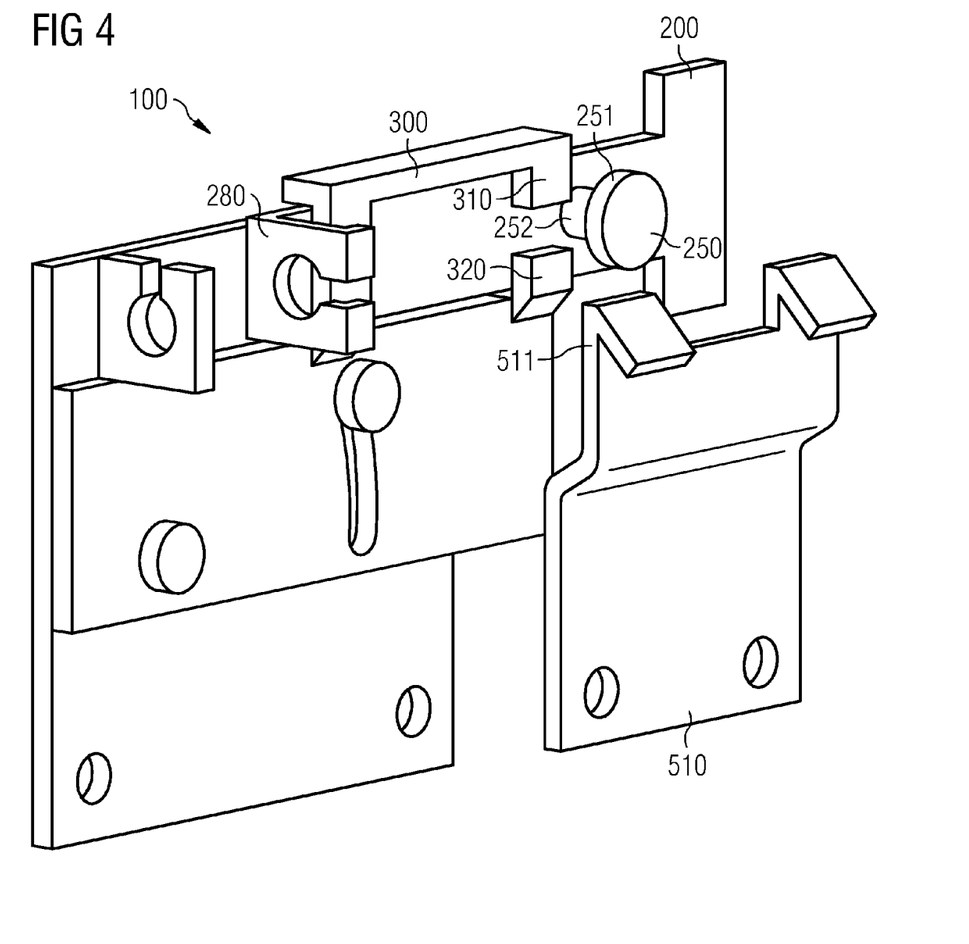
FIG. 4 shows the locking device with door interrogator in the first door interrogator position.

In FIG. 4 it is shown how the door interrogator 250 has been transferred by the door 500 into the first door interrogator position. In the first door interrogator position with the door 500 closed, the locking slider 200 can be transferred into the first position, in which the door 500 is locked, and into the second position, in which the door 500 is released for opening. The second section 252 is embodied such that the door interrogator 250 can be guided through the slot formed by the elements 310, 320 because the diameter of the second section 252 is less than the slot diameter. The door interrogator 250 can be embodied such that is movable between its at least two door interrogator positions only in the second position of the locking slider 200 in which the door 500 is released for opening.

Figure 5:
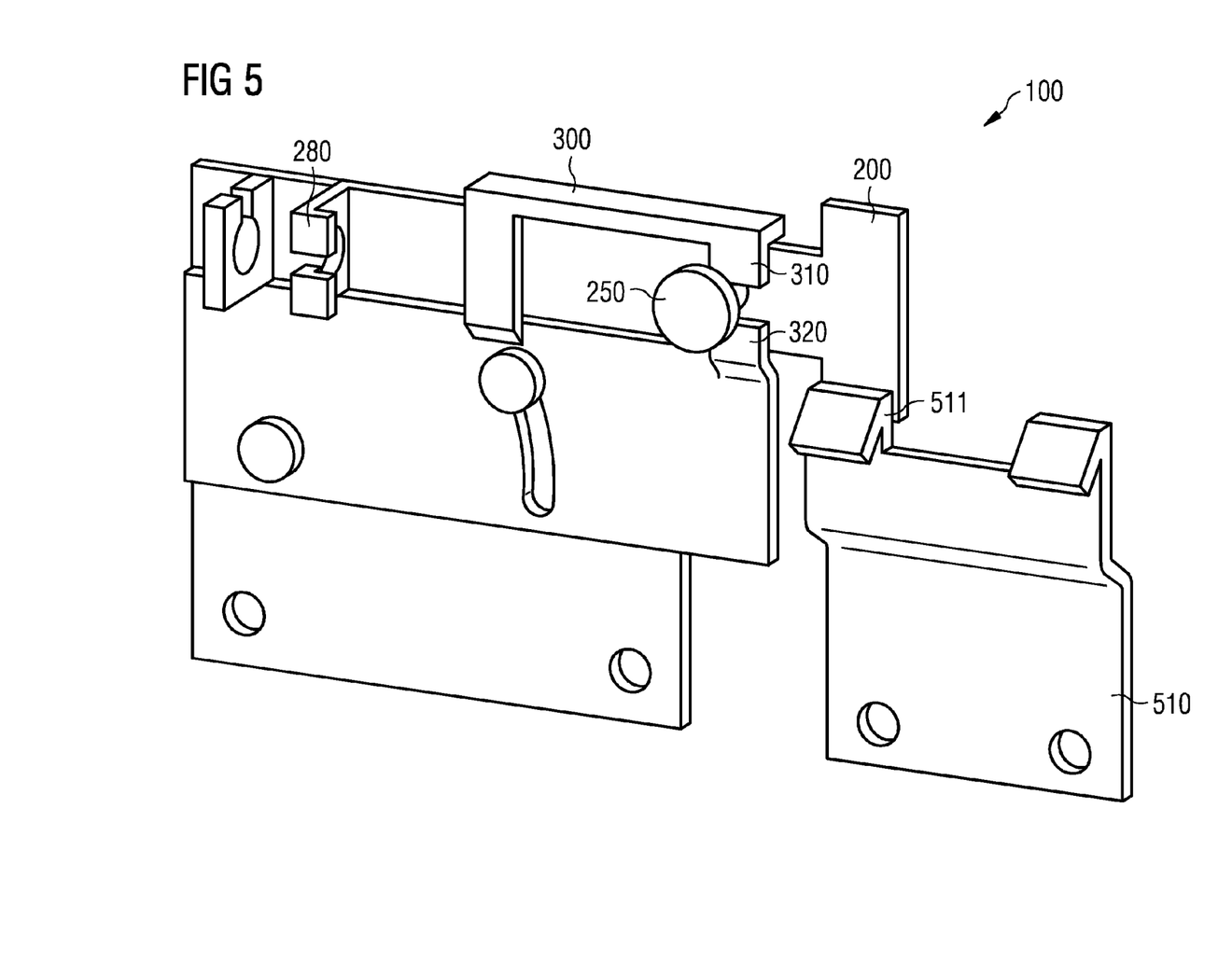
FIG. 5 shows the locking device with door interrogator in the first door interrogator position in which the second section of the door interrogator can be guided through the slot.

In FIG. 5 the locking slider 200 has been moved into the first position, in which the door 500 is locked. The door interrogator 250 is located in the first door interrogator position, such that the second section 252 cooperatively interacts with the slot of the retainer 300 and can be guided through the elements 310, 320 because the diameter of the second section 252 is less than the slot diameter.

The locking device 100 additionally comprises a door element 510 which is mounted on the door 500, wherein in the first position of the locking slider 200 the door 500 is locked in that the locking slider 200 engages the door element 510 from behind. This is shown accordingly in FIG. 5. The locking slider 200 engages the element 511 of the door element 510 from behind.

Figure 6A:
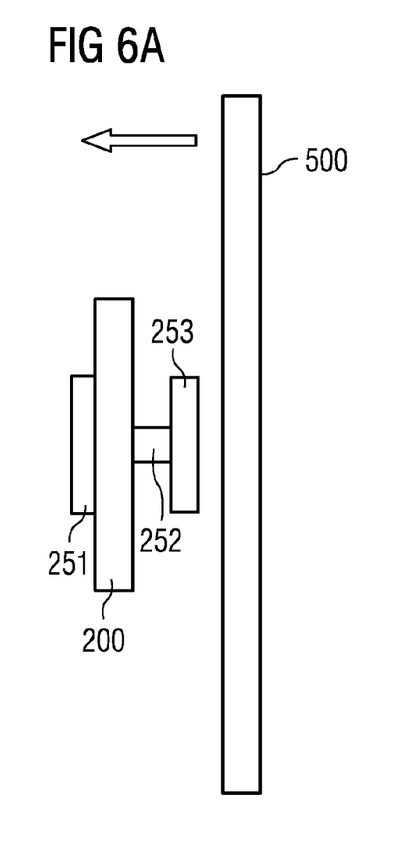
FIGS. 6A, 6B, 6C show the door interrogator with first and second sections, locking slider and door in a first and in a second door interrogator position.
Figure 6B:
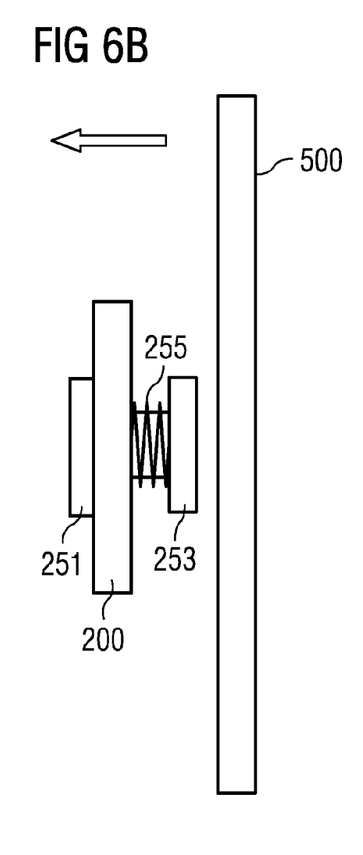
Figure 6C:
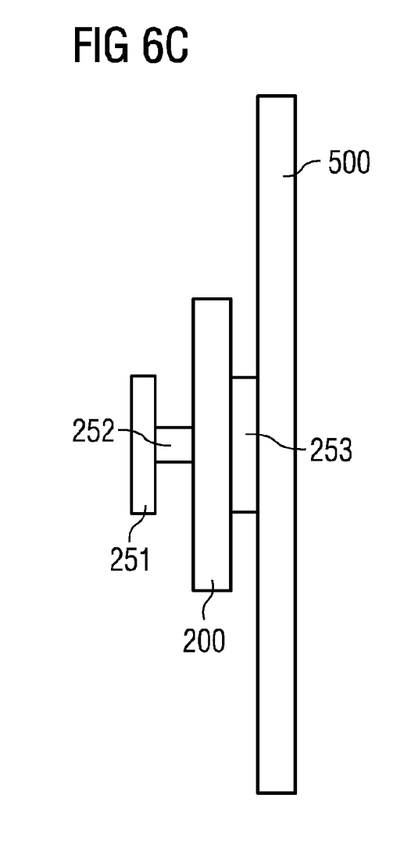

FIGS. 6A, 6B, 6C show the door interrogator 250 with first section 251 and second section 252, as well as the locking slider 200 and the door 500.

FIG. 6A shows the door interrogator 250 in the second door interrogator position with the door 500 open. Door 500 is not touching the door interrogator 250 and in order to close moves in the direction of the arrow. The door interrogator 250 is formed by a first section 251, a second section 252 and a third section 253. The third section 253 faces toward the door 500, while the first section 251 cooperatively interacts with the retainer 300 and the elements 310, 320 of the retainer 300. The second section 252 of the door interrogator 250 runs through the locking slider 200, and the first section 251 of the door interrogator 250 is located at the end of the second section 252 pointing away from the door 500. The third section 253 of the door interrogator 250 is located at the end of the second section 252 pointing toward the door 500.

In the second door interrogator position with the door 500 open, the first section 251 bears on the locking slider 200. It is also conceivable that in this position there is a gap between the first section 251 of the door interrogator 250 and the locking slider 200. Because the slot in the retainer 300 likewise cooperatively interacts directly with the locking slider 200, in the second door interrogator position the locking slider cannot be transferred into the first position for locking the door 500.

According to FIG. 6B the door interrogator 250 can additionally comprise a spring 255 which holds the door interrogator 250 in the second door interrogator position, in which the door 500 cannot be locked.

In FIG. 6C it is shown how the door interrogator 250 has been actuated by the door 500, which has been closed as indicated by the direction of the arrow in FIGS. 6A and 6B. The door interrogator 250 is actuated by means of the door 500; this means that the third section 253, which is touched by the door 500, is shifted to the left. This also causes the first section 251 and the second section 252 to be moved to the left. The first section 251 now no longer touches the locking slider 200. In the now reached first door interrogator position with the door 500 closed, the locking slider 200 can be moved into one of its at least two positions. In this first door interrogator position the second section 252 of the door interrogator 250 can be guided through the slot formed by the elements 310, 320 of the retainer 300 because the diameter of the second section 252 is less than the slot diameter.

The locking device 100 according to the invention and the switchgear cabinet comprising the locking device 100 according to the invention make it possible for an electrical switch to be actuated only with the door closed, and for the door to be locked simultaneously.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims.

Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A locking device for a door, the locking device comprising:
 a locking slider, slidable into at least two positions, wherein in a first position the door is locked and in a second position the door is released for opening, the locking slider including:
  a door interrogator, the door interrogator being displaceable by the door into at least two door interrogator positions, such that when the door interrogator is in a first of the at least two door interrogator positions with the door being closed, the door interrogator is configured to be in surface contact with the door and the locking slider being movable into one of the at least two positions, and such that when the door interrogator is in a second of the at least two door interrogator positions with the door being open, the door interrogator is configured to be spaced apart from the door and the locking slider not being movable into the first position for locking the door; and
 a guide within which the locking slider is slidably arranged to move between the at least two positions.

2. The locking device of claim 1, wherein the door interrogator is movable between the at least two door interrogator positions only in the second position of the locking slider.

3. The locking device of claim 1, wherein the door interrogator comprises a first section and a second section, wherein the sections include different diameters and are assigned to both of the at least two door interrogator positions wherein the guide comprises a retainer for the locking slider, the retainer including a slot with a slot opening, wherein in the second door interrogator position, the retainer prevents the locking slider from being moved in that the first section of the door interrogator is not guidable through the slot because the diameter of the first section is greater than the slot diameter and wherein in the first door interrogator position, the retainer enables the locking slider to be displaced in that the second section of the door interrogator is guidable through the slot because the diameter of the second section is less than the slot diameter.

4. The locking device of claim 3, wherein the door interrogator additionally comprises a spring which holds the door interrogator in the second door interrogator position, in which the locking slider is not movable into the first position for locking the door.

5. The locking device of claim 3, wherein the second section of the door interrogator runs through the locking slider and the first section of the door interrogator is located at the end of the second section pointing away from the door.

6. The locking device of claim 1, further comprising a door element mounted on the door, wherein in the first position of the locking slider, the door is locked in that the locking slider engages the door element from behind, and wherein in the second position of the locking slider, the locking slider releases the door for opening.

7. A switchgear cabinet comprising:
a switchgear cabinet door, and
a locking device of claim 1, wherein the of the locking device is formed by the switchgear cabinet door.

8. The switchgear cabinet as claimed in claim 7, comprising an electrical switch including a drive, wherein the electrical switch is operatively connected to the locking device such that the electrical switch is operateable only if the switchgear cabinet door is closed.

9. The switchgear cabinet of claim 7, wherein the electrical switch including the drive and the locking device are operatively connected by way of a Bowden cable.

10. The switchgear cabinet of claim 9, wherein the first end of the Bowden cable cooperatively interacts with the switching mechanism of the drive and the second end of the Bowden cable is connected to the locking slider such that, with the switchgear cabinet door open, the electrical switch is not operable and with the switchgear cabinet door closed, the electrical switch is operable.

11. The locking device of claim 2, wherein the door interrogator comprises a first section and a second section, wherein the sections include different diameters and are assigned to both of the at least two door interrogator positions wherein the guide comprises a retainer for the locking slider, the retainer including a slot with a slot opening, wherein in the second door interrogator position, the retainer prevents the locking slider from being moved in that the first section of the door interrogator is not guidable through the slot because the diameter of the first section is greater than the slot diameter and wherein in the first door interrogator position, the retainer enables the locking slider to be displaced in that the second section of the door interrogator is guidable through the slot because the diameter of the second section is less than the slot diameter.

12. The locking device of claim 11, wherein the door interrogator additionally comprises a spring which holds the door interrogator in the second door interrogator position, in which the locking slider is not movable into the first position for locking the door.

13. The locking device of claim 4, wherein the second section of the door interrogator runs through the locking slider and the first section of the door interrogator is located at the end of the second section pointing away from the door.

14. The switchgear cabinet of claim 8, wherein the electrical switch including the drive and the locking device are operatively connected by way of a Bowden cable.

15. The switchgear cabinet of claim 14, wherein the first end of the Bowden cable cooperatively interacts with the switching mechanism of the drive and the second end of the Bowden cable is connected to the locking slider such that, with the switchgear cabinet door open, the electrical switch is not operable and with the switchgear cabinet door closed, the electrical switch is operable.

\* \* \* \* \*